United States Patent [19]
Nakao

[11] Patent Number: 5,395,035
[45] Date of Patent: Mar. 7, 1995

[54] WIRE BONDING APPARATUS

[75] Inventor: Mitsuhiro Nakao, Yokohama

[73] Assignee: Kabushiki Kaisha Toshiba, Kawasaki, Japan

[21] Appl. No.: 160,678

[22] Filed: Dec. 2, 1993

[30] Foreign Application Priority Data

Dec. 3, 1992 [JP] Japan .................................. 4-323861

[51] Int. Cl.$^6$ ............................................. H01L 21/60
[52] U.S. Cl. ........................................... 228/4.5; 228/9
[58] Field of Search ................... 228/4.5, 180.5, 103, 228/102, 9

[56] References Cited

U.S. PATENT DOCUMENTS

| 4,327,860 | 5/1982 | Kirshenboin et al. | 228/180.5 |
| 4,445,633 | 5/1984 | Bonham, Jr. | 228/103 X |
| 4,445,633 | 5/1984 | Bonham, Jr. | 228/102 |
| 5,148,964 | 9/1992 | Shimizu | 228/102 |
| 5,150,828 | 9/1992 | Shimizu | 228/180.5 X |
| 5,156,323 | 10/1992 | Kumazawa et al. | 228/180.5 |

FOREIGN PATENT DOCUMENTS

| 0262777 | 8/1987 | European Pat. Off. |
| 0425966A1 | 10/1990 | European Pat. Off. |
| 59-150436 | 2/1983 | Japan |
| 4199522 | 11/1990 | Japan |

Primary Examiner—Kenneth J. Ramsey
Attorney, Agent, or Firm—Finnegan, Henderson, Farabow, Garrett & Dunner

[57] ABSTRACT

In the first operating unit, the bonding gap and the loop length of the bonding wire are calculated from the first and second bonding points. In the second operating unit, the length of the oblique line of the bonding wire, and the angle made between the oblique line and a line connecting the inner lead and the bed together are calculated from the bonding gap, the loop length, and the loop height. In the automatic operating unit, the reverse height, i.e. the distance by which the capillary is moved upward from the bonding pad position, the reverse amount, i.e. the distance by which the capillary, already ascended to the reverse height, is moved to the opposite side of the bonding position, and the capillary ascending amount, i.e. the distance by which the capillary, already moved by the reverse amount, is moved to the highest position of the capillary from the upper surface of the semiconductor chip are calculated from the length of the oblique line, the angle, and the loop height.

2 Claims, 3 Drawing Sheets

WIRE BONDING APPARATUS

BACKGROUND OF THE INVENTION

1. Field of the Invention

The present invention relates to a wire bonding apparatus, and especially to that used for a thin high-density package.

2. Description of the Related Art

The steps for wire-bonding a semiconductor by use of a conventional wire bonding apparatus will be described.

A semiconductor chip is placed on the bed of in a lead frame. A bonding pad is provided on the surface of the semiconductor chip. The position of the bonding pad is assigned as the first bonding position. A region close to the tip end of an inner lead of the lead frame is assigned as the second bonding position.

With the above-described structure, a capillary is conveyed to the first bonding position, One end of the bonding wire is extracted from the capillary, and this end of the bonding wire is electrically connected to the bonding pad at the first bonding position. Next, the capillary is moved in the direction vertical to the surface of the semiconductor chip by the first distance, and then moved in parallel with the surface of the semiconductor chip to the opposite side to the second bonding position by the second distance. After that, the capillary is moved in the direction vertical to the surface of the semiconductor chip by the third distance, and then conveyed to the second bonding position. While the capillary being carried, the trace of the conveyance has an arc shape. At the second bonding position, the other end of the bonding wire is electrically connected to the inner lead.

In the above-described conventional wire bonding device, the loop length defined between the first and second bonding positions is adjusted by the third distance. More specifically, each of the first and second distances is fixed to a certain value, and the loop length is adjusted by changing only the third distance. In the case where the loop length is adjusted in the just-mentioned manner, the relationship between the loop length and the loop height will be as shown in FIG. 1. As can be understood from this figure, the shorter the loop length, the lower the loop height.

Semiconductor devices are different from each other in loop length, and therefore when the semiconductor devices are subjected to wire bonding by use of the conventional wire bonding apparatus, the bonding wires of the devices do not have a constant loop height. In other words, an optimum loop height cannot be achieved in each bonding wire. Especially, in the case of a package with a great number of bonding wires and strict limitations to loop heights, such as a thin and high-density package, the wire bonding operation by use of the conventional wire bonding apparatus entails a problem as below.

In bed-bonding, in which a semiconductor chip is wire-bonded to a bed in a lead frame, since the height of the bed is lower than that of the inner lead, the loop height of this bonding wire is significantly lower than those of the other bonding wires. More specifically, the second bonding positions located near the tip ends of the inner leads are not accurately leveled with each other. Therefore, when a bonding operation is carried out for a bonding wire at its second bonding position, and this second bonding position is located lower than other second bonding positions, this bonding wire will be leveled lower than the other ones by the loop height. As a result, it is likely that an edge touch error, in which the bonding wire and the edge of the semiconductor chip touch with each other, or a bonding error caused by damages in the neck portion of the bonding wire, will occur.

SUMMARY OF THE INVENTION

The object of the invention is to provide a wire bonding apparatus which can optimize the height and shape of the loop in a bonding wire, and avoid the edge touch error and the bonding error.

The object of the invention is achieved by a wire bonding apparatus comprising:

recognizing means for recognizing a position of a bonding pad in a semiconductor chip and a bonding position of an inner lead in a lead frame;

first operation means for calculating a bonding gap and a loop length of a bonding wire from the bonding pad position and the bonding position; and second operation means for calculating a reverse height, a reverse amount, and a capillary ascending amount from the bonding gap and the loop length. The reverse height is defined as a distance by which the capillary is moved upward from the bonding pad position. The reverse amount is defined as a distance by which the capillary, already ascended to the reverse height, is moved to the opposite side of the bonding position. The capillary ascending amount is defined as a distance by which the capillary, already moved by the reverse amount, is moved to the highest position of the capillary from the upper surface of the semiconductor chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will now be described with reference to accompanying drawings.

Figure 1:
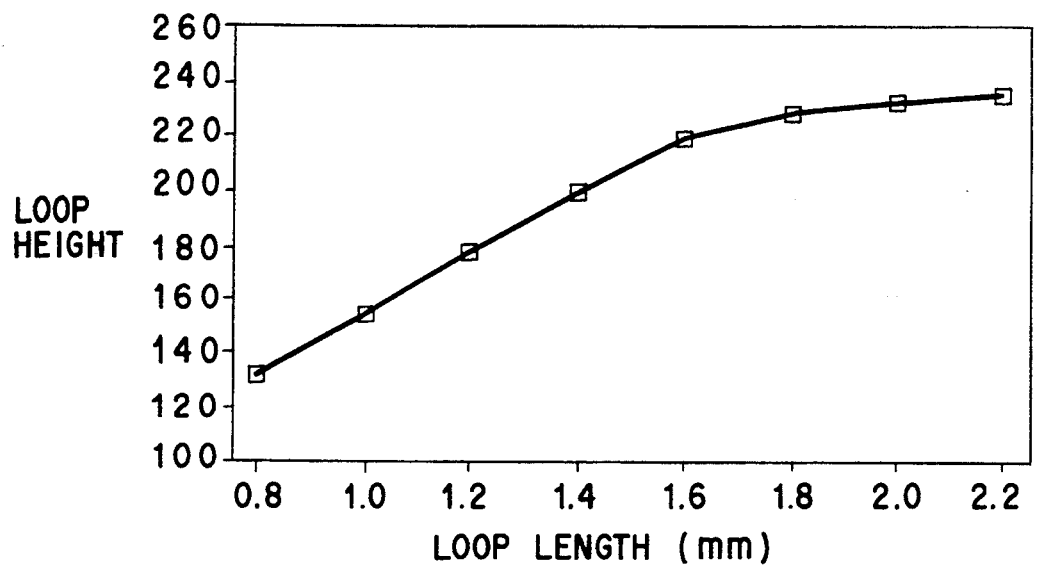
FIG. 1 is a graph showing the relationship between a loop length and a loop height of a bonding wire when wire-bonded by the conventional wire-bonding apparatus.
Figure 2:
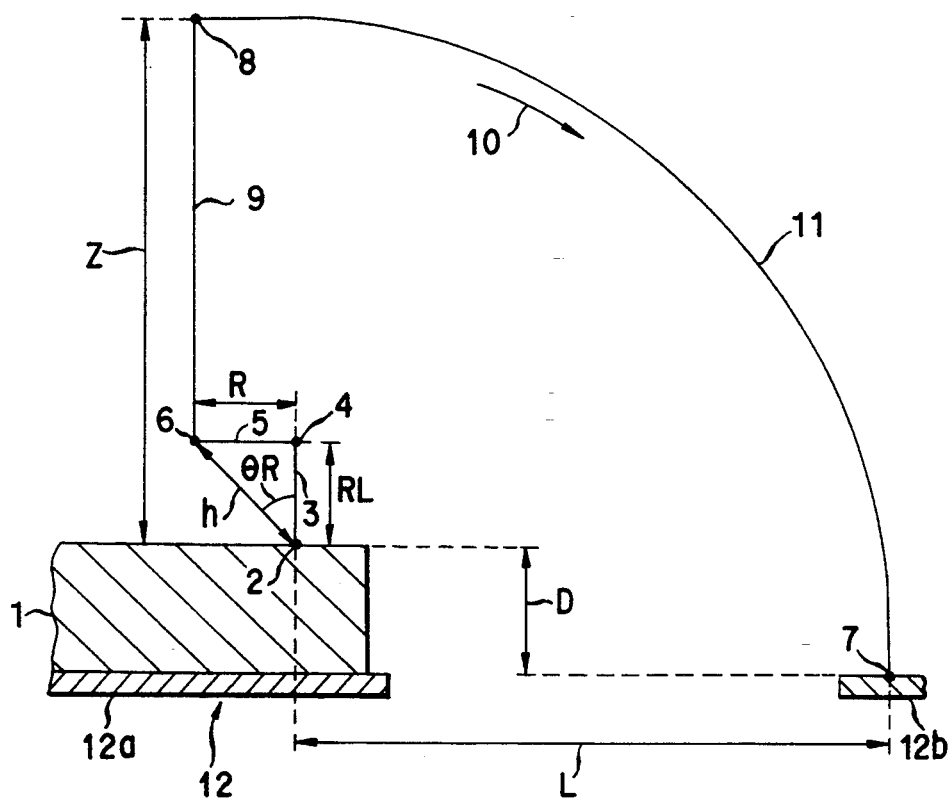
FIG. 2 is a cross section of the main portion of the wire bonding apparatus according to the first and second embodiments of the present invention.

FIG. 2 is a cross section of a semiconductor device while being wire-bonded in a wire bonding step by the wire bonding apparatus according to the first embodiment of the present invention. As shown in this figure, a semiconductor chip 1 is placed on a bed 12a in a lead frame 12. A capillary, not shown, is moved to a position above a bonding pad, not shown, in the surface of the semiconductor chip 1. One end of a bonding wire, not shown, is drawn out of the capillary. This end of the bonding wire is electrically connected to a first bonding point 2, which is located at the position of the bonding pad. After that, the capillary is moved along with a first moving pathway 3, that is in the direction vertical to the surface of the semiconductor chip 1. Thus, the capillary is moved to a first position 4, the height of which with respect to the surface of the semiconductor chip 1, i.e. reverse height, is $R_L$.

Next, the capillary is moved from the first position 4 to a second position 6 along a second moving pathway 5 having a distance, i.e. reverse amount, of R. More specifically, the capillary is moved along the second moving pathway 5 which runs in the direction vertical to the first moving pathway 3 in the plane including the first moving pathway 3 and a line connecting the first bonding point 2 and the second bonding point 7 in the inner lead 12b with each other. The capillary is moved along the plane.

After that, the capillary is moved from the second position 6 to a third position 8 along a third moving pathway 9. The third moving pathway 9 runs vertically with respect to the second moving pathway 5. A capillary ascending amount Z is defined between the surface of the semiconductor chip and the third position 8, and is the sum of the distance of the first moving pathway 3 and the distance of the third moving pathway 9.

Next, the capillary is moved from the third position 8 to a second bonding point 7 along a fourth moving pathway 11 which is a curve indicated by arrow 10. Then, the other end of the bonding wire is electrically connected to the inner lead 12b at the second bonding point 7.

In the above wire bonding step, the capillary is moved as described above, and the semiconductor chip 1 and the inner lead 12b are electrically connected with each other by means of a bonding wire. A loop length L of the bonding wire is not the actual length of the bonding wire itself, but the appearing length from one end of the wire to the other when viewed from the top. A bonding gap D is a difference in the direction vertical to the surface of the semiconductor chip 1 between the first and second bonding points 2 and 7. A loop height h is a distance between the first bonding point 2 and the second position 6. A reverse angle $\theta$ is an angle made between the line connecting the first bonding point 6 and the second position 6 together, and the first moving pathway 3.

Figure 3:
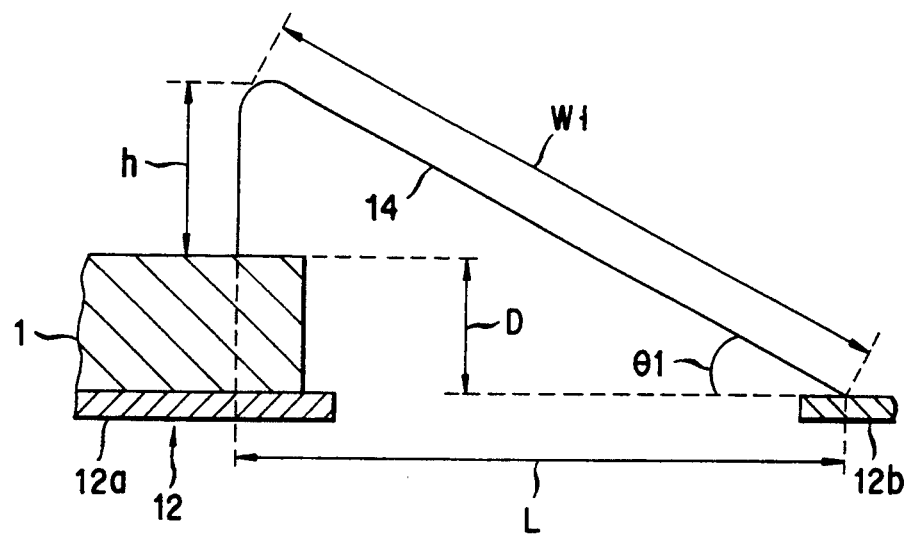
FIG. 3 is a cross section of the main portion of a semiconductor device subjected to wire bonding using the wire bonding apparatus shown in FIG. 2.

FIG. 3 is a cross section of the main portion of a semiconductor device subjected to a wire bonding using the wire bonding apparatus shown in FIG. 2, and briefly shows a triangle loop shape of the bonding wire. In FIG. 3, the same elements are designated by the same reference numerals as those in FIG. 2.

As shown in this figure, a semiconductor chip 1 is placed on a bed 12a in a lead frame 12. A bonding pad, not shown, is provided on the surface of the semiconductor chip 1. One end of a bonding wire 14 is connected to the bonding pad, whereas the other end of the bonding wire is connected to a point close to the tip end of an inner lead 12b of the lead frame 12.

Reference letter h denotes a loop height of the bonding wire 14; $W_1$: a length of the oblique line of the triangle loop in the bonding wire 14; $\theta_1$: an angle made between the oblique line $W_1$ and a straight line connecting the inner lead 12b and the bed 12a together; D: a bonding gap; and L is a loop length of the bonding wire 14.

A wire bonding step for shaping the bonding wire 14 into a loop will now be described.

Figure 4:
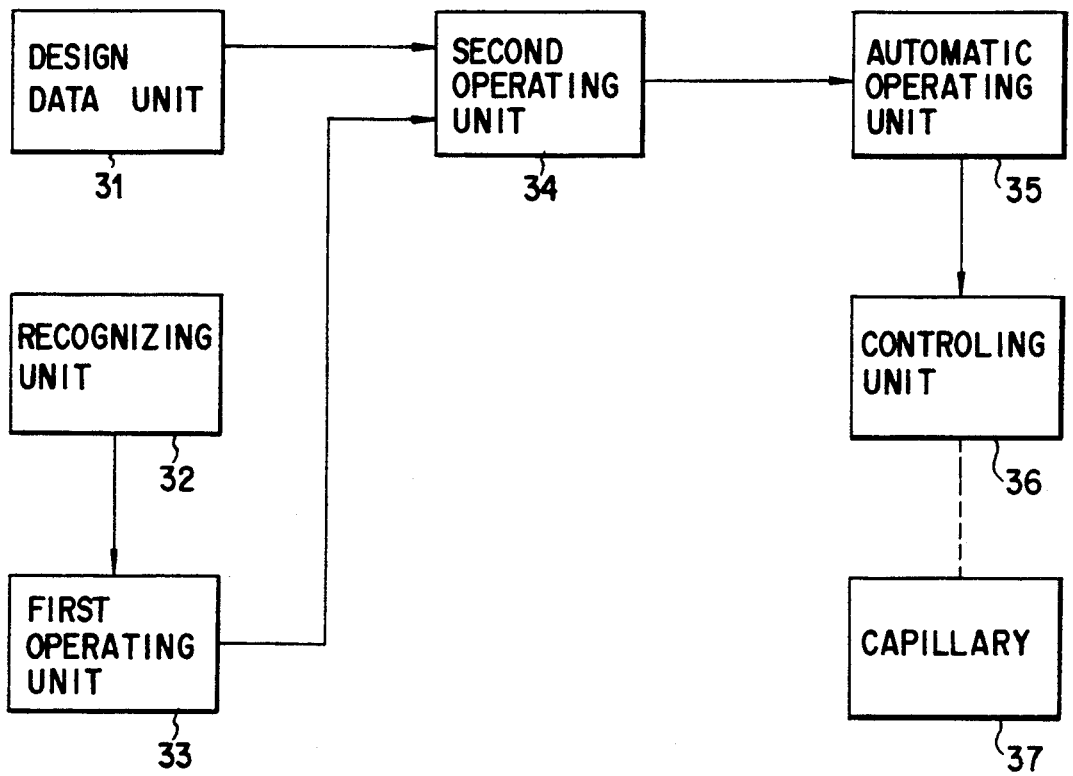
FIG. 4 is a block diagram showing the constitution of a wire bonding apparatus according to the first and second embodiments according to the present invention.

FIG. 4 is a block diagram showing the constitution of the wire bonding apparatus according to the first embodiment of the present invention. First, the data of a loop height h shown in FIG. 3 is input to a design data unit 31 consisting of memories.

After that, a recognizing unit 32 serves to recognize the position of the bonding pad in the semiconductor chip 1 actually placed on the bed 12a of the lead frame 12, that is, the first bonding point 2 shown in FIG. 2. Then, the second bonding point 7 in the inner lead 12b is recognized.

The data of the first and second bonding points 2 and 7 thus recognized are sent to the first operating unit 33. In the first operating unit 33, the bonding gap D and the loop length are calculated from the first and second bonding points 2 and 7.

After that, the data of the bonding gap D, the loop length L, and the loop height h are sent to the second operating unit 34. In the second operating unit 34, values of $\theta 1$ and $W_1$ shown in FIG. 3 are calculated out from the following equations (1) and (2) with use of the bonding gap D, the loop length L, and the loop height h.

$$\theta_1 = \tan^{-1}\{(h+D)/L\} \quad (1)$$

$$W_1 = L/\cos\theta_1 \quad (2)$$

Then, the data of the $\theta_1$ and $W_1$ thus calculated, and the loop height h are sent to an automatic operating unit 35. In the automatic operating unit 35, values of reverse angle $\theta_R$, reverse amount R and reverse height $R_L$ are calculated out from the following equations (3) to (6) with use of the above data of $\theta_1$, $W_1$, and h.

$$\theta_R = \alpha \cdot \theta_1 \quad (3)$$

$$R = h \cdot \sin\theta_R \quad (4)$$

$$R_L = h \cdot \cos\theta_R \quad (5)$$

$$Z = W_1 + R_L \quad (6)$$

where $\alpha$ is a constant.

After that, the values of reverse angle $\theta_R$, reverse amount R, reverse height $R_L$, and capillary ascending amount Z are sent to the control unit 36 connected to the capillary 37. The movement of the capillary 37 is controlled by the control unit 36 with the above structure, the wire bonding operation is carried out in a semiconductor device. Thus, the loop height of a bonding wire can be set to a loop height h input to the design data unit 31.

Figure 5:
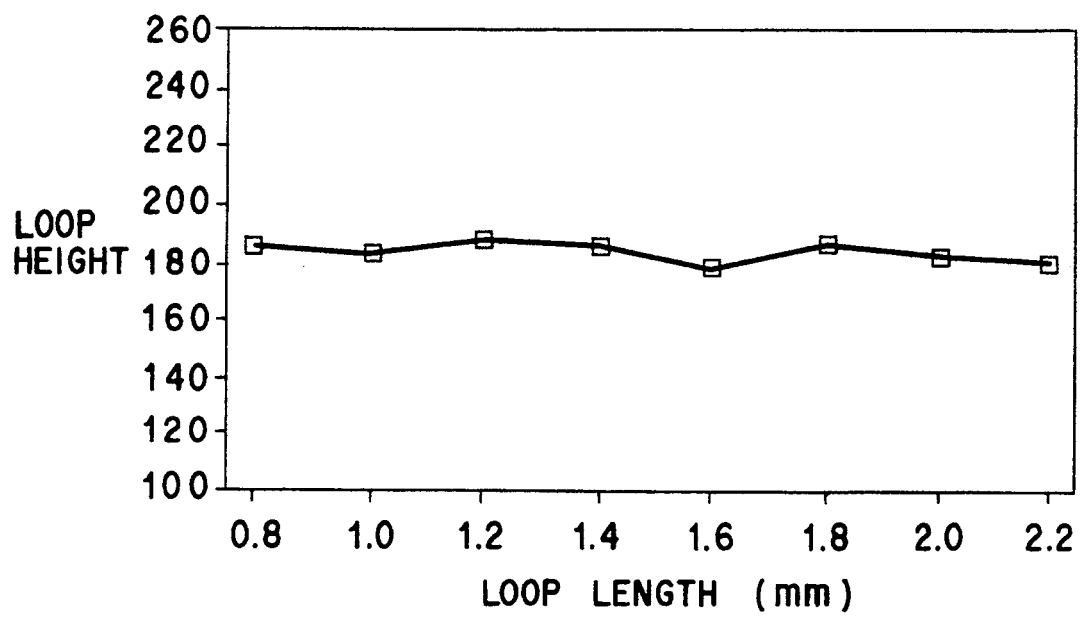
FIG. 5 is a graph showing the relationship between a loop length and a loop height of a bonding wire when wire-bonded by the wire-bonding apparatus according to the first embodiment of the invention.

FIG. 5 is a graph showing the relationship between the loop length and loop height in a bonding wire subjected to the wire bonding as above. ? It is understood from this figure that a constant loop height can be obtained if the loop length varies.

According to the first embodiment, the first and second bonding points 2 and 7 are recognized by the recognizing unit 32. From these first and second bonding points 2 and 7, the bonding gap D and the loop length L in a bonding wire 14 are calculated out by the first operating unit 33. The values of $\theta_1$ and $W_1$ are calculated by the second operating unit 34 from the bonding gap D, the loop length L, and the loop height h input in the design data unit 31. The values of reverse angle $\theta_R$, reverse amount R, reverse height $R_L$ and capillary ascending amount Z are calculated out by the automatic operating unit 35 from the above data of $\theta_1$, $W_1$, and h. Consequently, if the lengths L of loops in a semiconductor device differ from each other, the loop height L of all the bonding wires 14 in the semiconductor device can be made constant with the values of the reverse angle $\theta_R$, reverse amount R, reverse height $R_L$, and capillary ascending amount Z calculated for each of the loop lengths L. Consequently, the wire bonding can be carried out for the optimum loop height h. In addition, the shape of the loop of each bonding wire can be made triangle, which is the optimum shape for the bonding wire.

Further, in the recognizing unit 32, the first and second bonding points 2 and 7 are recognized so as to calculate the reverse angle $\theta_R$, reverse amount R, reverse height $R_L$, and capillary ascending amount Z. Therefore, if the second bonding point 7 is leveled lower than other ones as in the case where the semiconductor chip 1 is wire-bonded to the bed 12a in the lead frame 12, the loop height h of the bonding wire 14 is leveled with the other ones. Consequently, the edge touch error, in which a bonding wire 14 touches the edge of a semiconductor chip 1, and the bonding error, in which the neck portion of a bonding wire 14 is damaged, can be avoided.

Further, the wire bonding apparatus according to the present invention is particularly useful for the semiconductor device such as a thin and high-density package, in which the loop length is random, and the loop height should be set stably at low.

Figure 6:
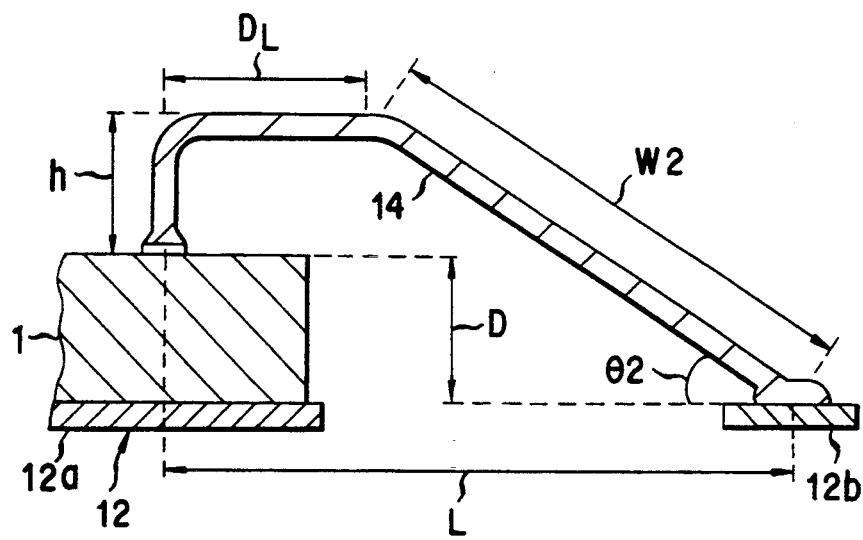
FIG. 6 is a cross section of the main portion of the wire bonding apparatus according to the second embodiment of the present invention.

FIG. 6 is a cross section showing the main portion of a semiconductor device subjected to wire bonding by use of the wire bonding apparatus according to the second embodiment of the present invention. In this figure, the same elements are designated by the same reference numerals as those in FIG. 3, and the explanations therefor will be omitted.

The loop of the bonding wire 14 is shaped into a trapezoid.

Reference letter $D_L$ is the length of the top line of the trapezoid loop of the bonding wire 14; $W_2$: the length of the oblique line of the trapezoid loop of the bonding wire 14; and $\theta_2$: the angle made between the oblique line $W_2$ and a line connecting the inner lead 12b and the bed 12a together.

A wire bonding step in which a bonding wire 14 is shaped into a loop shape as above will now be described. In the first embodiment, explanations for the same elements will be omitted.

The data of the loop height h shown in FIG. 6 is input to the design data unit 31 shown in FIG. 4.

In the second operating unit 34, the values $\theta_2$ and $W_2$ shown in FIG. 6 are calculated from the following equations (7) and (8) based on the data of the bonding gap D, the loop length L, and the loop height h $$\theta_2 = \tan^{-1}\{(h+D)/(L-D_L)\} \quad (7)$$

$$W_2 = (L-D_L)/\cos\theta_2 \quad (8)$$

After that, the data of $\theta_2$ and $W_2$ thus calculated, and a loop height h are sent to the automatic operating unit 35. In the automatic operating unit 35, the reverse angle $\theta_R$, reverse amount R, reverse height $R_L$, and capillary ascending amount Z are calculated from the $\theta_2$, $W_2$, and loop height h.

Thus, in the second embodiment, the same advantage as of the first embodiment can be achieved.

It should be noted here that the wire bonding apparatus of the present invention is not limited to the above embodiments. For example, the operation method in each of the first and second operating units 33 and 34, and the automatic operating unit 35, may be remodeled in various ways. Further, in accordance with the remodeling, the loop shape of the bonding wire may be change to another.

Additional advantages and modifications will readily occur to those skilled in the art. Therefore, the invention in its broader aspects is not limited to the specific details, and representative devices and shown and described herein. Accordingly, various modifications may be made without departing from the spirit or scope of the general inventive concept as defined by the appended claims and their equivalents.

What is claimed is:

1. A wire bonding apparatus comprising:

recognizing means for recognizing a bonding pad position in a semiconductor chip and a bonding position of an inner lead in a lead frame;

first operation means for calculating a bonding gap and a loop length of a bonding wire from tile bonding pad position and the bonding position;

second operation means for calculating from the bonding gap, the loop length and a design loop height of the bonding wire, a length of an oblique line of a loop of the bonding wire, and an angle of the oblique line of the loop, said angle of the oblique line of the loop being an angle formed between the oblique line and a surface of the inner lead; and third operation means for calculating a reverse angle from the angle of the oblique line of the loop, and for calculating from the reverse angle, the length of the oblique line and the loop height, a reverse height, a reverse amount and a capillary ascending amount, said reverse height being a distance by which a bonding wire supply capillary is moved upward from the bonding pad position, said reverse amount being a distance by which the capillary, already ascended to the reverse height, is moved to the opposite side of the bonding position, and said capillary ascending amount being a distance by which the capillary, already moved by the reverse amount, is moved to the highest position of the capillary from the upper surface of the semiconductor chip, said reverse angle being an angle formed between a line connecting the capillary moved to the reverse height and the position of the bonding pad, and a line connecting the capillary moved by the reverse amount and the bonding pad.

2. A wire bonding apparatus according to claim 1, further comprising storing means for storing design data of the loop height of the bonding wire.

* * * * *

UNITED STATES PATENT AND TRADEMARK OFFICE
CERTIFICATE OF CORRECTION

PATENT NO. : 5,395,035
DATED : March 07, 1995
INVENTOR(S) : Mitsuhiro NAKAO et al It is certified that error appears in the above-indentified patent and that said Letters Patent is hereby corrected as shown below:

Claim 1, Column 6, Line 44, "tile" should read --the--.

Signed and Sealed this

Eleventh Day of July, 1995

Attest:

BRUCE LEHMAN

Attesting Officer          Commissioner of Patents and Trademarks